(12) United States Patent
Kim et al.

(10) Patent No.: US 11,404,137 B1
(45) Date of Patent: Aug. 2, 2022

(54) MEMORY SYSTEM AND OPERATING METHOD OF MEMORY SYSTEM

(71) Applicant: SK hynix Inc., Gyeonggi-do (KR)

(72) Inventors: Jin Pyo Kim, Gyeonggi-do (KR); Ji Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/376,391

(22) Filed: Jul. 15, 2021

(30) Foreign Application Priority Data

Feb. 9, 2021 (KR) .................. 10-2021-0018011

(51) Int. Cl.
| | | |
|---|---|---|
| *G11C 29/42* | (2006.01) | |
| *G11C 29/18* | (2006.01) | |
| *G11C 7/20* | (2006.01) | |
| *G11C 16/16* | (2006.01) | |
| *G11C 29/12* | (2006.01) | |

(52) U.S. Cl.
CPC .............. *G11C 29/42* (2013.01); *G11C 7/20* (2013.01); *G11C 16/16* (2013.01); *G11C 29/12005* (2013.01); *G11C 29/18* (2013.01); *G11C 2029/1802* (2013.01)

(58) Field of Classification Search
CPC .......... G11C 7/20; G11C 29/42; G11C 16/16; G11C 29/18; G11C 29/12005
See application file for complete search history.

(56) References Cited

U.S. PATENT DOCUMENTS

| | | | | |
|---|---|---|---|---|
| 2019/0347015 | A1* | 11/2019 | Luo .................. | G11C 29/52 |
| 2020/0211603 | A1* | 7/2020 | Luo .................. | G11C 11/4099 |
| 2021/0103405 | A1* | 4/2021 | Jang ................. | G06F 3/0673 |

FOREIGN PATENT DOCUMENTS

| | | |
|---|---|---|
| KR | 10-1765830 B1 | 8/2017 |
| KR | 10-2102248 B1 | 4/2020 |

* cited by examiner

*Primary Examiner* — Han Yang
(74) *Attorney, Agent, or Firm* — IP & T Group LLP

(57) ABSTRACT

Embodiments of the present disclosure relate to a memory system and an operating method of the memory system. According to embodiments of the present disclosure, a memory system may include a main core for executing an operation of a first layer and a plurality of sub-cores for executing an operation of a second layer, and the main core may control, when executing a shutdown command received from a host, the plurality of sub-cores so that a second sub-core stores a meta data segment to be processed by a first sub-core among the plurality of sub-cores.

15 Claims, 13 Drawing Sheets

MEMORY SYSTEM AND OPERATING METHOD OF MEMORY SYSTEM

CROSS-REFERENCE TO RELATED APPLICATION

The present application claims priority under 35 U.S.C. 119(a) to Korean patent application number 10-2021-0018011 filed on Feb. 9, 2021, which is incorporated herein by reference in its entirety.

BACKGROUND

1. Technical Field

The embodiments of the present disclosure relate to a memory system and an operating method of the memory system.

2. Related Art

A memory system includes a data storage device that stores data on the basis of a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

Moreover, in the process of executing a shutdown operation, a memory system may store meta data changed in the process of writing data to the memory device in the memory device.

SUMMARY

Embodiments of the present disclosure may provide a memory system and an operating method of the memory system capable of preventing a problem in that a time for performing a shutdown operation increases due to a delay in a time for a specific core to store meta data in a memory device.

In one aspect, embodiments of the present disclosure may provide a memory system having a memory device including a plurality of memory dies, and a memory controller for communicating with the memory device and controlling the memory device.

The memory controller may include a main core for executing an operation of a first layer, and a plurality of sub-cores for executing an operation of a second layer which is a lower layer of the first layer. In this case, each of the plurality of sub-cores may execute an operation of storing meta data in a corresponding memory die among the plurality of memory dies.

The main core, when executing a shutdown command received from a host attempting to shut down the memory system, may control the plurality of sub-cores so that a second sub-core among the plurality of sub-cores stores a meta data segment, which is at least a part of a changed part among meta data to be processed by a first sub-core among the plurality of sub-cores.

In another aspect, embodiments of the present disclosure may provide an operating method of a memory system including a plurality of memory dies, a main core executing an operation of a first layer, and a plurality of sub-cores executing an operation of a second layer which is a lower layer of the first layer, wherein each of the plurality of sub-cores may execute an operation of storing meta data in a corresponding memory die among the plurality of memory dies.

The operating method of the memory system may include receiving a shutdown command from a host attempting to shut down the memory system.

The operating method of the memory system may include selecting, by the main core during execution of the shutdown command, a second sub-core to process a meta data segment which is at least a part of a changed part among meta data to be processed by a first sub-core among the plurality of sub-cores.

The operating method of the memory system may include controlling, by the main core, the plurality of sub-cores so that the second sub-core processes the meta data segment.

In another aspect, embodiments of the present disclosure may provide a controller having first and second sub-cores configured to drive first and second flash translation layers (FTLs) to control a nonvolatile memory device to perform operations on a first die and a second die included therein, respectively, the operations of the first and second FTLs being independent of each other and a main core.

The main core may control, when the controller is shut down, the first and second sub-cores to store a first meta segment, which is handled by the first sub-core before the shut-down, into the second die.

The main core may control, when the controller is boot up after the shut-down, the first and second sub-cores to move the first meta segment from the second die to the first die.

The second sub-core may provide, when storing the first meta segment, the main core with information on the first and second sub-cores and a location where the first meta segment is stored within the second die.

The main core may control, during the boot-up, the first and second sub-cores based on the information.

According to embodiments of the present disclosure, it is possible to prevent a time for performing a shutdown operation which increases due to a delay in a time for a specific core to store meta data in a memory device.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
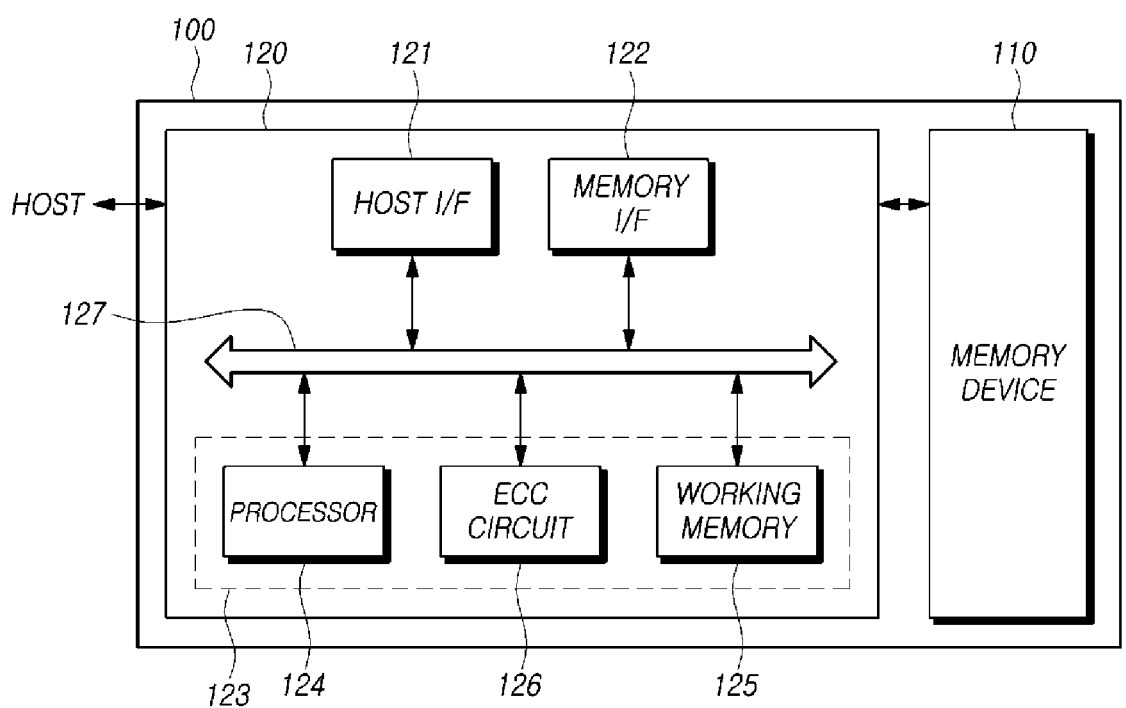
FIG. 1 is a schematic diagram illustrating a configuration of a memory system based on an embodiment of the disclosed technology.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written to, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (SU-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. That is, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this patent document, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all of the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
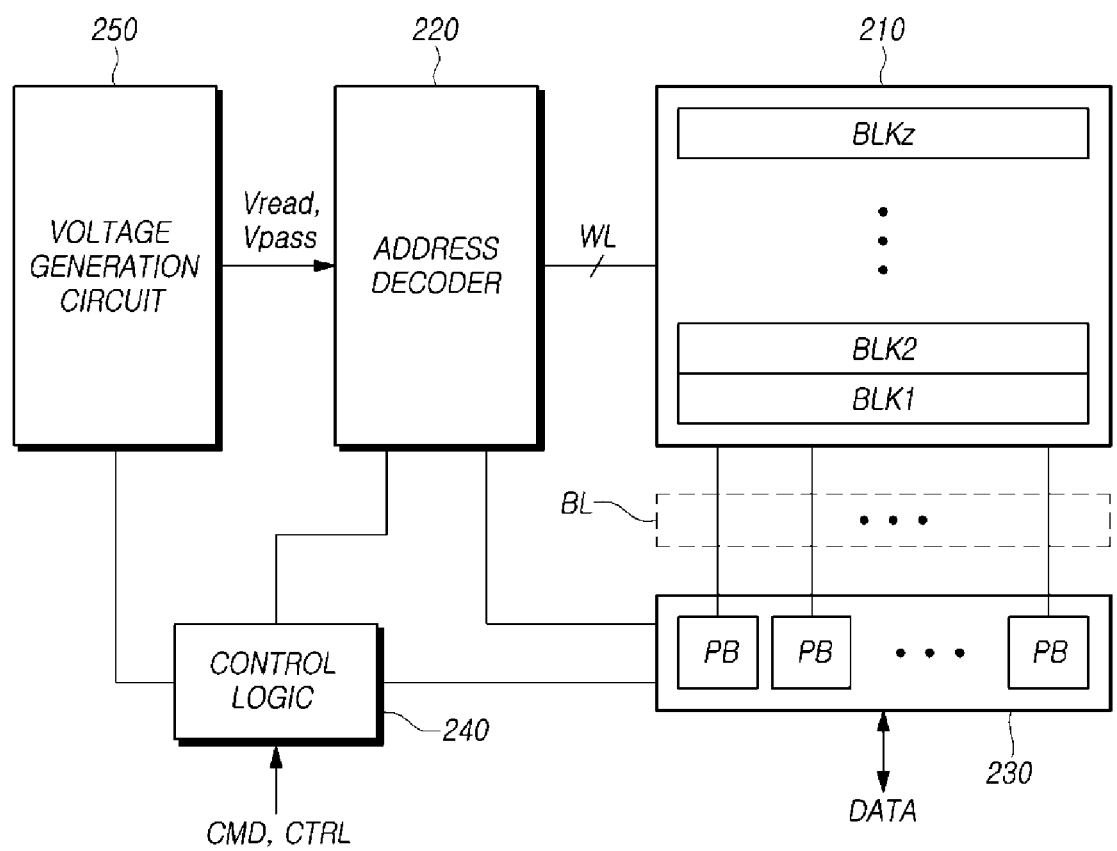
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or greater than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit is lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
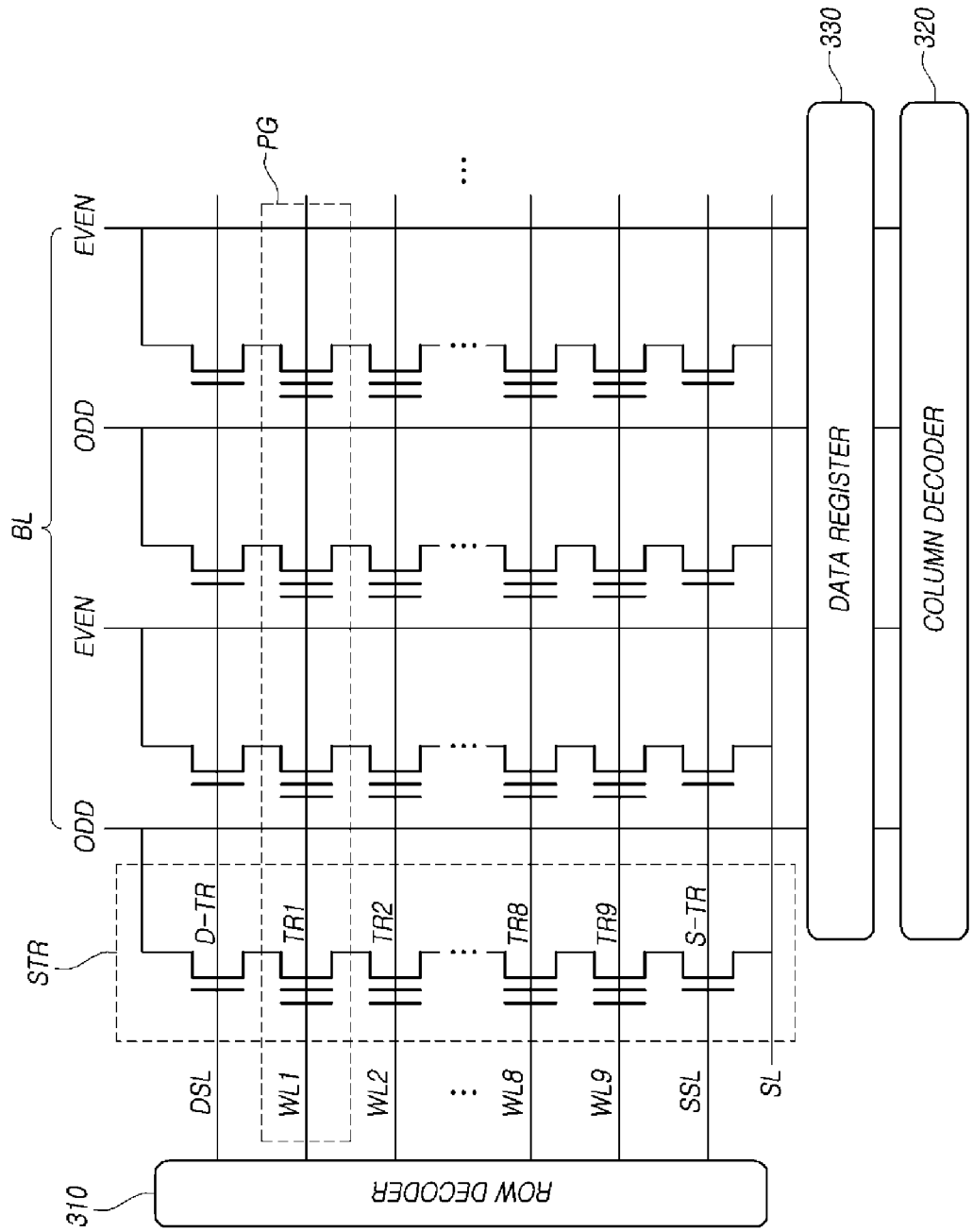
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) which includes circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
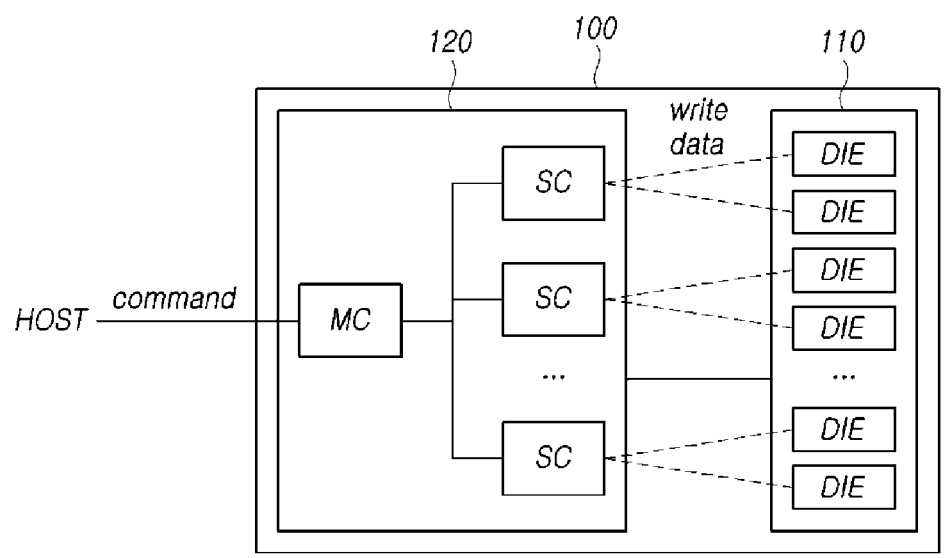
FIG. 4 is a diagram illustrating a schematic structure of a memory system according to embodiments of the present disclosure.

FIG. 4 is a diagram illustrating a schematic structure of a memory system 100 according to embodiments of the present disclosure.

Referring to FIG. 4, a memory controller 120 of the memory system 100 may include a main core MC and a plurality of sub-cores SC. Each of the main core MC and the plurality of sub-cores SC may be a processor core included in a processor 124 of FIG. 1 or may be implemented as a core included in a separate processor chip. The main core MC and the plurality of sub-cores SC may execute respective processes or respective threads in parallel with each other. In addition, the main core MC and the plurality of sub-cores SC may transmit and receive an inter-core communication message between cores.

In addition, a memory device 110 of the memory system 100 may include a plurality of memory dies DIE. In this case, each memory die DIE may include one or more memory blocks described in FIG. 1.

In embodiments of the present disclosure, each of the plurality of memory dies DIE may correspond to one of the plurality of sub-cores SC, and each of the plurality of sub-cores SC may correspond to one or more memory dies DIE. Each sub-core SC may control an operation of writing data to a corresponding memory die DIE. In this case, the data may be user data or meta data for managing user data.

Each sub-core SC and one or more corresponding memory dies DIE may communicate using a common channel. In this case, the channels used by different sub-cores SC are different from each other, and each sub-core SC cannot access remaining memory dies DIE other than the corresponding memory dies DIE through a different channel.

In addition, the memory system 100 may process a command received from a host HOST. For example, the memory system 100 may process a shutdown command requesting shutdown of the memory system 100 in addition to a read command, a write command, and an erase command. Processing a command received from a host HOST means that executing operations indicated by the command received from a host HOST.

For example, when a specific situation occurs, e.g., when the user terminates the operation of the host HOST, when the power supplied to the host HOST is unstable, or when an unrecoverable error occurs in the host HOST, the host may transmit the shutdown command to the memory system 100 to turn off the memory system 100 or to switch to a low power consumption mode.

Further, upon receiving the shutdown command, the memory system 100 may be turned off after performing an operation required for shutdown such as storing changed meta data to the memory device 110 so that the memory system 100 may operate normally when rebooted after shutdown.

Hereinafter, an operation of executing the shutdown command received from the host HOST by the memory system 100 in FIG. 5 will be described.

Figure 5:
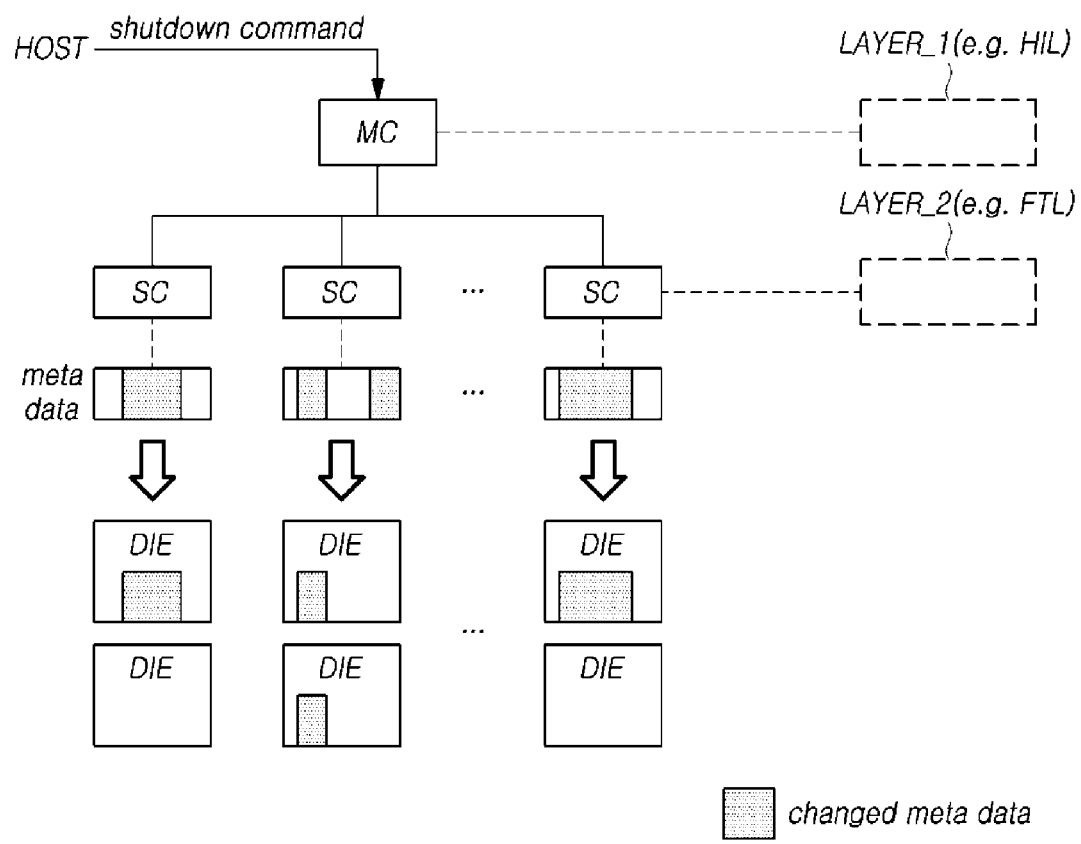
FIG. 5 is a diagram illustrating an operation of executing a shutdown command by a memory system according to embodiments of the present disclosure.

FIG. 5 is a diagram illustrating an operation of executing a shutdown command by a memory system 100 according to embodiments of the present disclosure.

Referring to FIG. 5, when the memory system 100 receives a shutdown command from a host HOST, a main core MC included in a memory controller 120 of the memory system 100 may control the plurality of sub-cores SC so that the plurality of sub-cores SC respectively performs an operation required for shutdown.

The main core MC may execute a function of a first layer LAYER_1. For example, the first layer LAYER_1 may be a host interface layer HIL described in FIG. 1.

The plurality of sub-cores SC may execute a function of a second layer LAYER_2, which is a lower layer of the first layer LAYER_1. For example, the second layer LAYER_2 may be the flash translation layer FTL described in FIG. 1.

When the memory system 100 receives the shutdown command from the host, each of the plurality of sub-cores SC may execute an operation of storing changed meta data in a corresponding memory die DIE in order to perform a shutdown operation.

In this case, the changed meta data may include, for example, map data, i.e., mapping information between logical addresses and physical addresses created during data writing or background operations such as garbage collection, a valid page table indicating whether a page included in the memory die DIE stores valid data, and a change information for one of the bad memory blocks included in the memory die DIE.

Each of the plurality of sub-cores SC may store changed meta data among meta data for the corresponding memory die DIE in the corresponding memory die DIE within the memory device 110.

In general, each of the plurality of sub-cores SC processes only meta data for the corresponding memory die DIE and does not process meta data managed by other sub-cores.

In addition, each of the plurality of sub-cores SC may store, in the corresponding memory die DIE, a changed part of the meta data for the corresponding memory die DIE. To this end, each sub-core SC may communicate with the corresponding memory die DIE through a channel allocated to the sub-core SC and the corresponding memory die DIE.

However, in the case that each of the plurality of sub-cores SC independently processes the meta data for the corresponding memory die DIE, there may be a delay in processing the shutdown command by the host.

As an example, a data write/erase operation may intensively occur on a memory die corresponding to a first sub-core among the plurality of sub-cores SC. If the host repeatedly requests the memory system 100 to refresh data stored on the memory die corresponding to the first sub-core, the data write/erase operations may intensively occur on a memory die corresponding to the first sub-core.

In this case, since the first sub-core has a larger amount of meta data to be processed during the shutdown operation than other sub-cores, an amount of time required to store the meta data in a memory die corresponding to the first sub-core is longer than that of other sub-cores.

On the other hand, although any remaining sub-cores have already completed their own operation of storing the meta data into the corresponding memory die DIE, the sub-core is required to wait until the first sub-core completes the operation of storing the meta data in the memory die corresponding to the first sub-core.

In addition, after the operation of storing the meta data in the memory die corresponding to the first sub-core is completed, the memory system 100 is shut down. Accordingly, the delay time required for the memory system 100 to complete the shutdown operation may increase due to the first sub-core.

Accordingly, the main core MC may identify a sub-core, which requires a large amount of time to process an operation of storing meta data in the corresponding memory die, among a plurality of sub-cores SC, and may control other sub-cores to share the burden of the operations requiring the large amount of time. As a result, the memory system 100 may prevent a problem in that the time for performing the shutdown operation increases as a whole due to a delay in a time for a specific sub-core to store meta data in the memory device.

Figure 6:
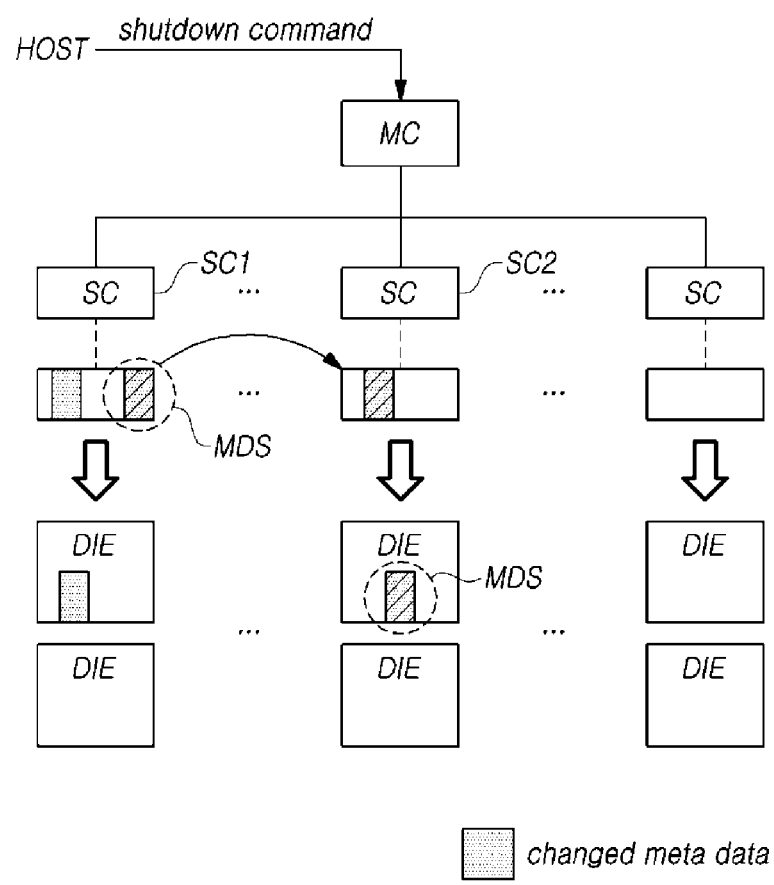
FIG. 6 is a diagram illustrating an example of an operation in which a main core controls a plurality of sub-cores according to embodiments of the present disclosure.

FIG. 6 is a diagram illustrating an example of an operation in which a main core MC controls a plurality of sub-cores SC according to embodiments of the present disclosure.

Referring to FIG. 6, a main core MC may control a plurality of sub-cores SC so that a second sub-core SC2 among the plurality of sub-cores SC processes a meta data segment MDS, which is at least a part of a changed part among meta data to be processed by a first sub-core SC1 among the plurality of sub-cores SC.

That is, the main core MC controls a selected sub-core among remaining sub-cores to share the burden of the unprocessed part of the changed meta data to be processed by the first sub-core SC1 so that it is possible to prevent an increase in the total time required for the memory system 100 to execute a shutdown command received from a host HOST.

In this case, the meta data segment MDS is not stored in the memory die DIE corresponding to the first sub-core SC1, but stored in the memory die DIE corresponding to the second sub-core SC2.

To this end, the main core MC may determine a second sub-core SC2 to store the meta data segment MDS from among the plurality of sub-cores SC and may instruct the second sub-core SC2 to store the meta data segment MDS in the memory die DIE corresponding to the second sub-core SC2.

Hereinafter, an operation in which the main core MC determines the second sub-core SC2 from among the plurality of sub-cores SC will be described.

Figure 7:
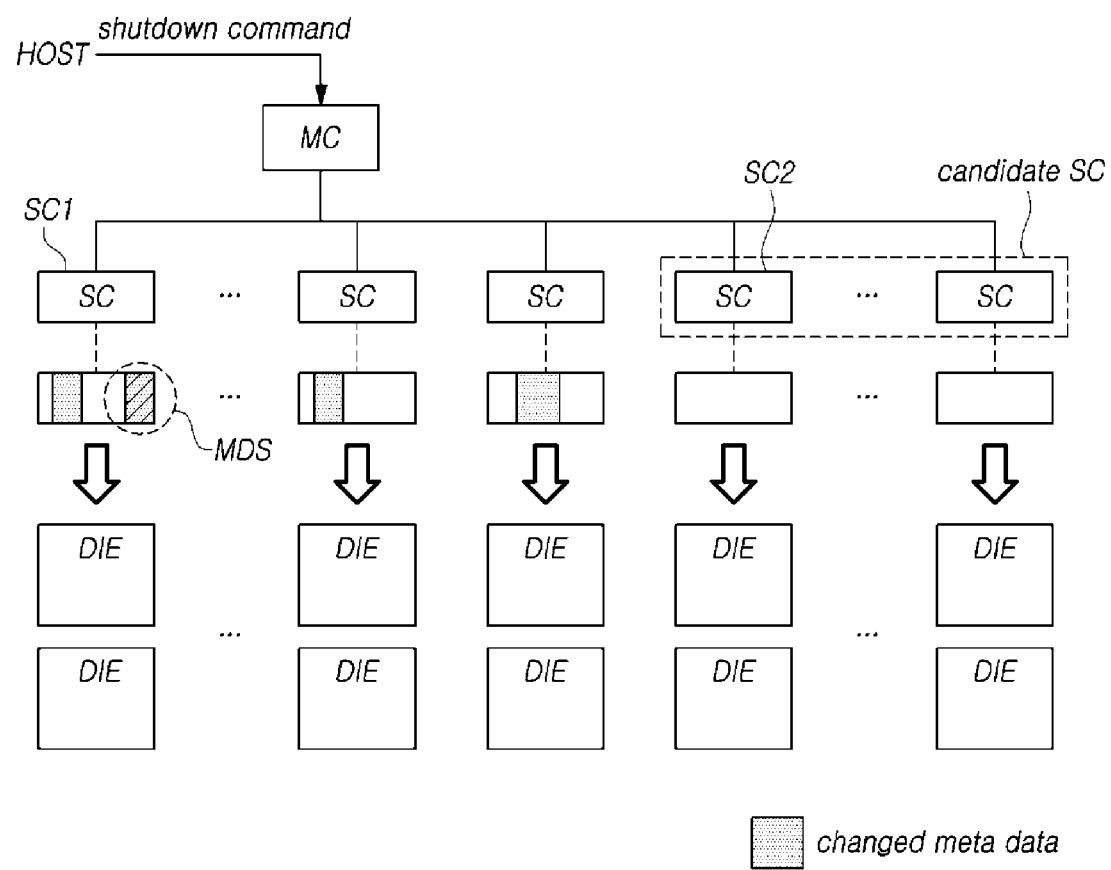
FIG. 7 is a diagram illustrating an example of an operation of determining, by a memory system, a candidate sub-core for a second sub-core according to embodiments of the present disclosure.

FIG. 7 is a diagram illustrating an example of an operation of determining, by a memory system 100, a candidate sub-core for a second sub-core SC2 according to embodiments of the present disclosure.

If the memory controller 120 determines as the second sub-core SC2 a sub-core that has not yet completed an operation of storing meta data for a corresponding memory die, the second sub-core SC2 is required to simultaneously process not only meta data to be processed by itself, but also meta data to be processed by the first sub-core SC1. Accordingly, since the time required for the second sub-core SC2 to process a shutdown operation increases, there may be a problem that the total time required for the memory system 100 to perform a shutdown operation increases.

Further, when receiving a shutdown command from a host, some of the plurality of sub-cores SC may enter a busy state from an idle state by processing an operation other than a shutdown operation. In this case, if the sub-core in the busy state processes a meta data segment MDS to be processed by the first sub-core SC1, the timing at which the meta data segment MDS is stored in the memory die DIE may be delayed due to other operations processed by the corresponding sub-core. Accordingly, there may still be a problem in that the total time required for the memory system 100 to perform the shutdown operation increases.

In order to prevent this problem, the main core MC may determine, as candidate sub-cores for the second sub-core SC2 among the plurality of sub-cores SC, one or more sub-cores, which have completed their own operations of storing changed meta data in corresponding memory dies and are in an idle state.

In the case that there are more than one candidate sub-core, which have completed the operation of storing changed meta data in a corresponding memory die and is in an idle state, the main core MC may determine one of the candidate sub-cores as the second sub-core SC2.

For example, the main core MC may determine a randomly selected sub-core of the candidate sub-cores as the second sub-core SC2.

As another example, the main core MC may determine as the second sub-core SC2 a sub-core satisfying a specific condition among candidate sub-cores.

Specifically, the main core MC may determine as the second sub-core SC2, a sub-core of which the corresponding memory dies includes meta data storage blocks having the smallest total erase counts, among the candidate sub-cores. Hereinafter, this will be described in detail in FIG. 8.

Figure 8:
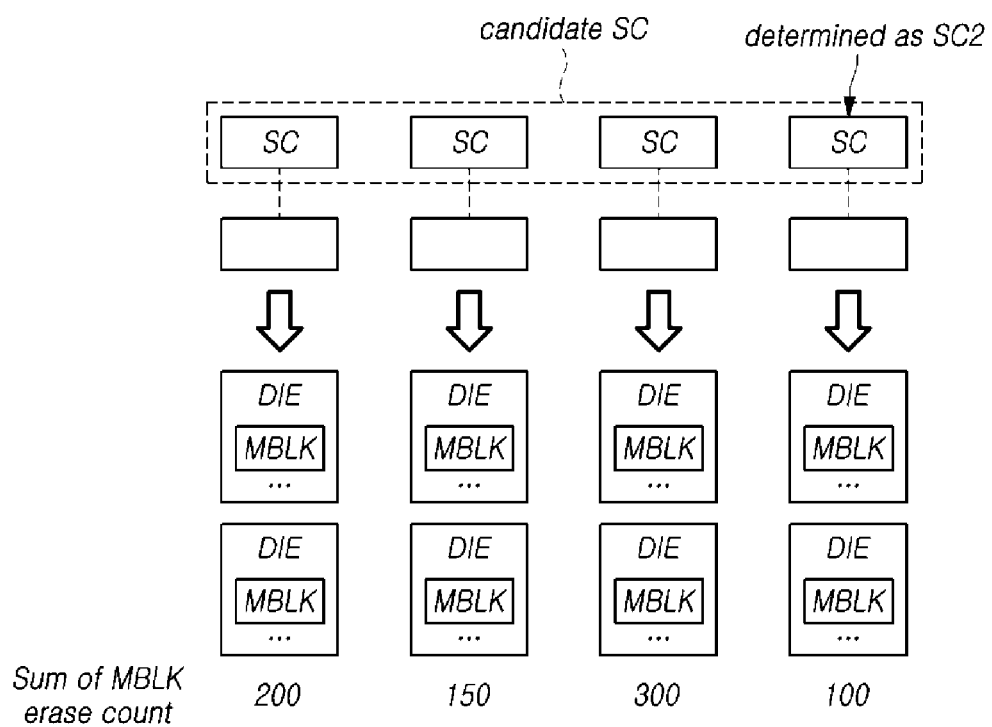
FIG. 8 is a diagram illustrating an example of determining a second sub-core from among the candidate sub-cores determined in FIG. 7 according to embodiments of the present disclosure.

FIG. 8 is a diagram illustrating an example of determining a second sub-core SC2 from among the candidate sub-cores determined in FIG. 7 according to embodiments of the present disclosure.

Referring to FIG. 8, the memory die DIE corresponding to each of the candidate sub-cores may include a meta data storage block MBLK. The meta data storage blocks MBLK may be a memory block described in FIG. 1 or a set of one or more memory blocks.

In FIG. 8, the total sum of erase counts of meta data storage blocks included in the memory die DIE corresponding to each of the candidate sub-cores is 200, 150, 300, and 100, respectively.

In this case, the main core MC may determine as the second sub-core SC2 a sub-core SC, of which the corresponding memory die includes the meta data storage blocks having a total of 100 erase counts.

In the above example, an operation has been described in which the main core MC determines the second sub-core SC2 from among the plurality of sub-cores SC.

Hereinafter, an operation in which the main core MC controls the second sub-core SC2 to process a meta data segment MDS will be described.

Figure 9:
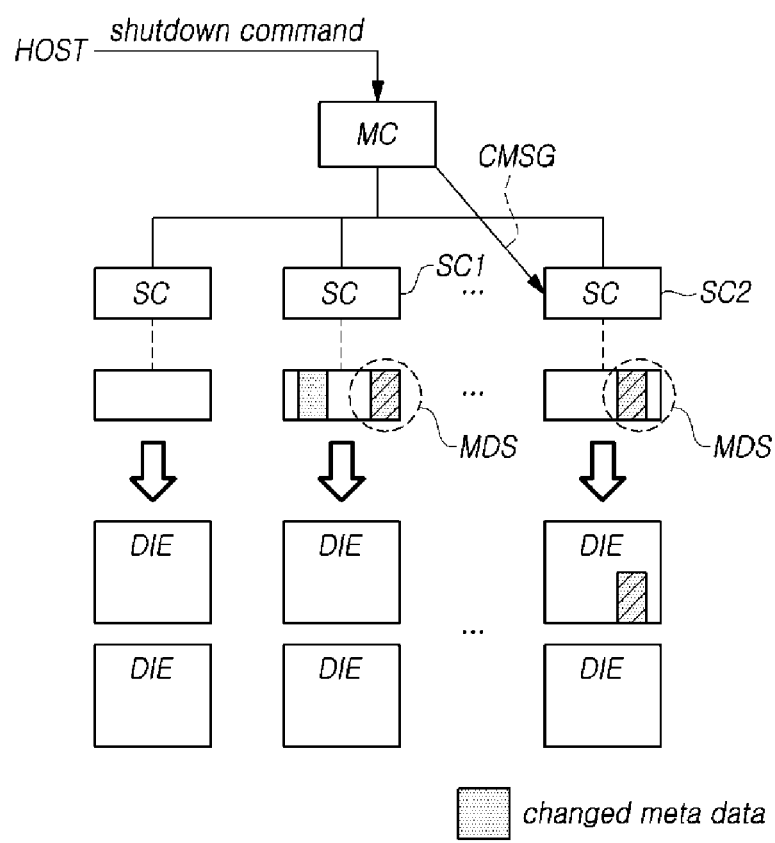
FIG. 9 is a diagram illustrating an example of a control operation of a main core for a meta data segment to be processed by a second sub-core according to embodiments of the present disclosure.

FIG. 9 is a diagram illustrating an example of a control operation of a main core MC in order for a meta data segment MDS to be processed by a second sub-core SC2 according to embodiments of the present disclosure.

Referring to FIG. 9, a main core MC may transmit an inter-core communication message CMSG instructing the second sub-core SC2 to process the meta data segment MDS to the second sub-core SC2 in order for the second sub-core SC2 to process the meta data segment MDS.

After receiving the inter-core communication message from the main core MC, the second sub-core SC2 may acquire the meta data segment MDS from the first sub-core SC1. In addition, the second sub-core SC2 may store the meta data segment MDS on a memory die corresponding to the second sub-core SC2.

In this case, the inter-core communication message CMSG may be transmitted from the main core MC to the second sub-core SC2 through various inter-process communication (IPC) technologies. For example, the inter-core communication message CMSG may be transmitted to the second sub-core SC2 through a mail slot, a pipe, or a socket.

Figure 10:
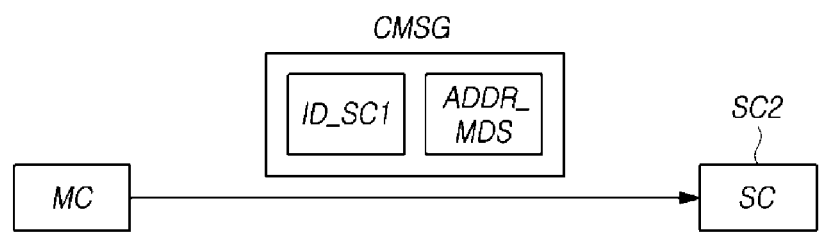
FIG. 10 is a diagram illustrating an example of an inter-core communication message described in FIG. 9 according to embodiments of the present disclosure.

FIG. 10 is a diagram illustrating an example of an inter-core communication message CMSG described in FIG. 9 according to embodiments of the present disclosure.

Referring to FIG. 10, an inter-core communication message CMSG may include an identifier ID_SC1 of a first sub-core SC1 and an address ADDR_MDS of a location where a meta data segment MDS is stored. The identifier ID_SC1 of the first sub-core SC1 may be used to identify the sub-core of a meta data segment MDS to be stored in a memory die corresponding to the second sub-core SC2. In addition, the address ADDR_MDS of the location where the meta data segment MDS is stored may be used in order for the second sub-core SC2 to acquire information of the meta data segment MDS. The address ADDR_MDS may indicate the location of the meta data segment MDS in the first sub-core SC1.

In embodiments of the present disclosure, the meta data segment MDS that is supposed to be stored in the memory die DIE corresponding to the first sub-core SC1 is stored in a memory die DIE corresponding to the second sub-core SC2.

Therefore, when the memory system first boots after executing the shutdown command, the memory system 100 is required to recover the meta data segment MDS stored in the memory die corresponding to the second sub-core SC2 to be stored in the memory die corresponding to the first sub-core SC1.

Figure 11:
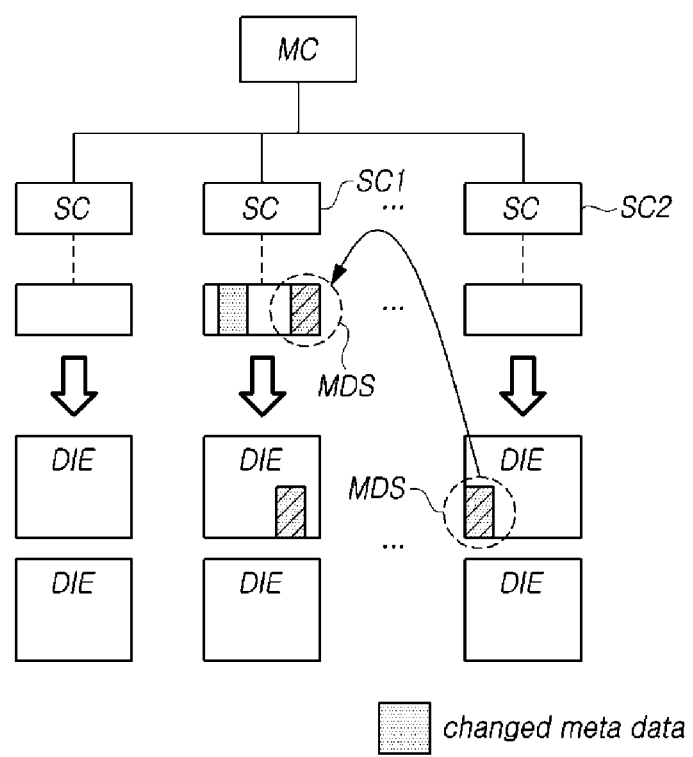
FIG. 11 is a diagram illustrating an example of an operation executed when a memory system is first booted after shutdown according to embodiments of the present disclosure.

FIG. 11 is a diagram illustrating an example of an operation executed when a memory system 100 is first booted after shutdown according to embodiments of the present disclosure.

Referring to FIG. 11, the main core MC may, at a first boot after executing the shutdown command, control the first sub-core SC1 and the second sub-core SC2 to store a meta data segment processed by the second sub-core SC2 in a memory die corresponding to the first sub-core SC1.

As an example, when the second sub-core SC2 stores the meta data segment MDS in a corresponding memory die, the second sub-core SC2 may reflect information on the meta data segment MDS, e.g., the identifier for the first sub-core SC1, the identifier for the second sub-core SC2, the location where the meta data segment MDS is stored within the memory die corresponding to the second sub-core SC2, on the meta data for a first layer LAYER_1 described above.

Upon first booting after executing a shutdown command, the main core MC may check information on the meta data segment MDS e.g., the identifier for the first sub-core SC1, the identifier for the second sub-core SC2, the location where the meta data segment MDS is stored within the memory die corresponding to the second sub-core SC2 based on the meta data for the first layer LAYER_1.

In addition, the main core MC may control the first sub-core SC1 and the second sub-core SC2 based on the information on the meta data segment MDS, so that the meta data segment MDS stored in a memory die corresponding to the second sub-core SC2 in the shutdown is transmitted to the first sub-core SC1.

After receiving the meta data segment MDS, the first sub-core SC1 may store the meta data segment MDS in a memory die DIE corresponding to the first sub-core SC1.

Figure 12:
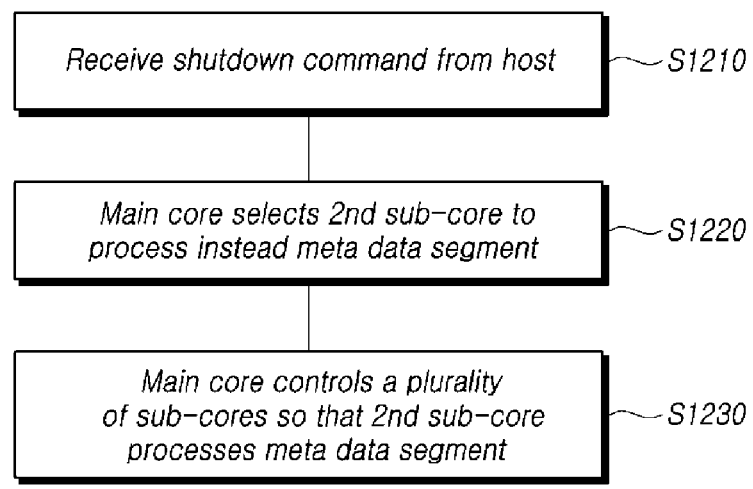
FIG. 12 is a diagram illustrating an operating method of a memory system according to embodiments of the present disclosure.

FIG. 12 is a diagram illustrating an operating method of a memory system 100 according to embodiments of the present disclosure.

Referring to FIG. 12, the operating method of the memory system 100 may include receiving a shutdown command from a host HOST attempting to shut down the memory system 100 (S1210).

In addition, the operating method of the memory system 100 may include selecting, during execution of the shutdown command, by the main core MC for executing an operation of a first layer LAYER_1, a second sub-core SC2 to process a meta data segment MDS which is at least a part of a changed part among meta data to be processed by a first sub-core SC1 among the plurality of sub-cores executing an operation of a second layer LAYER_2 which is a lower layer of the first layer LAYER_1 (S1220). Each of the plurality of sub-cores SC may execute an operation of storing meta data in a corresponding memory die DIE among the plurality of memory dies DIE included in a memory device 110.

As an example, the first layer LAYER_1 may be a host interface layer HIL and the second layer LAYER_2 may be a flash translation layer FTL.

For example, in operation S1120, the main core MC may determine, as candidate sub-cores for the second sub-core SC2 among the plurality of sub-cores, one or more sub-cores, which have completed their own operations of storing changed meta data for corresponding memory dies and are in an idle state. In this case, among the candidate sub-cores, a sub-core, of which a corresponding memory die includes meta data storage blocks MBLK having the smallest total erase counts, may be determined as the second sub-core SC2.

In addition, the operating method of the memory system 100 may include controlling, by the main core MC, the plurality of sub-cores SC so that the second sub-core SC2 processes the meta data segment MDS (S1230).

As an example, the main core MC may transmit an inter-core communication message CMSG to the second sub-core SC2 in order for the second sub-core SC2 to process the meta data segment MDS that is supposed to be processed by the first sub-core SC1. In this case, the inter-core communication message CMSG may include an identifier of the first sub-core SC1 and an address of a location where the meta data segment MDS is stored.

Moreover, the operating method of the memory system 100 may further include, at a first boot after executing the shutdown command, controlling the first sub-core SC1 and the second sub-core SC2 to store the meta data segment MDS processed by the second sub-core SC2 in a memory die corresponding to the first sub-core SC1.

Figure 13:
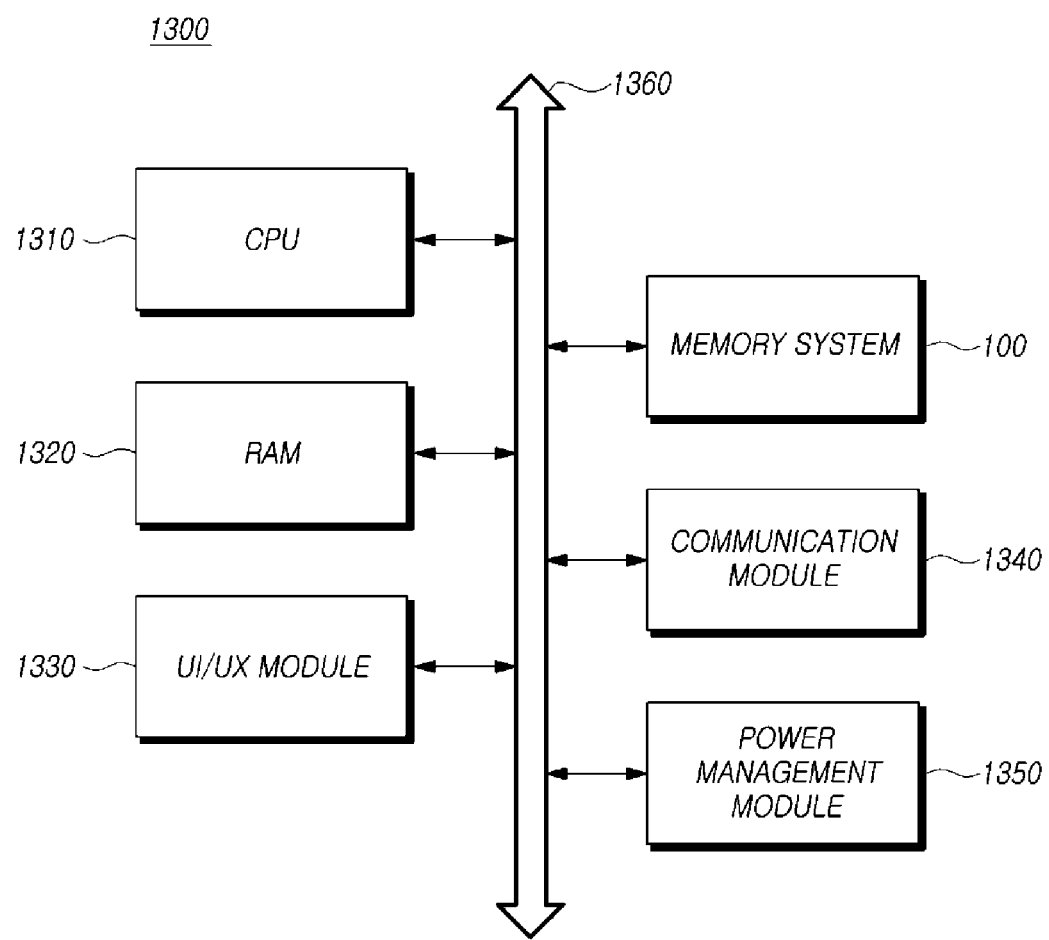
FIG. 13 is a diagram illustrating the configuration of a computing system based on embodiments of the disclosed technology.

FIG. 13 is a diagram illustrating the configuration of a computing system 1300 based on an embodiment of the disclosed technology.

Referring to FIG. 13, the computing system 1300 based on an embodiment of the disclosed technology may include: a memory system 100 electrically connected to a system bus 1360; a CPU 1310 configured to control the overall operation of the computing system 1300; a RAM 1320 configured to store data and information related to operations of the computing system 1300; a user interface/user experience (UI/UX) module 1330 configured to provide the user with a user environment; a communication module 1340 configured to communicate with an external device as a wired and/or wireless type; and a power management module 1350 configured to manage power used by the computing system 1300.

The computing system 1300 may be a personal computer (PC) or may include a mobile terminal such as a smartphone, a tablet or various electronic devices.

The computing system 1300 may further include a battery for supplying an operating voltage, and may further include an application chipset, a graphic-related module, a camera image processor, and a DRAM. Other elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure and the following claims. Furthermore, the embodiments may be combined to form additional embodiments.

What is claimed is:

1. A memory system comprising:
   a memory device including a plurality of memory dies; and
   a memory controller for communicating with the memory device and controlling the memory device,
   wherein the memory controller comprises:
   a main core for executing an operation of a first layer; and
   a plurality of sub-cores for executing an operation of a second layer which is a lower layer of the first layer, each of the plurality of sub-cores being configured to execute an operation of storing meta data in a corresponding memory die among the plurality of memory dies, and
   wherein the main core, when executing a shutdown command received from a host attempting to shut down the memory system, controls the plurality of sub-cores so that a second sub-core among the plurality of sub-cores stores a meta data segment, which is at least a part of a changed part among meta data to be processed by a first sub-core among the plurality of sub-cores.

2. The memory system of claim 1, wherein the first layer is a host interface layer (HIL), and the second layer is a flash translation layer (FTL).

3. The memory system of claim 1, wherein the main core determines, as candidate sub-cores for the second sub-core among the plurality of sub-cores, one or more sub-cores, which have completed the operation of storing changed meta data in the corresponding memory dies and are in an idle state.

4. The memory system of claim 3, wherein the main core determines, as the second sub-core among the candidate sub-cores, a sub-core, of which the corresponding memory die includes meta data storage blocks having a least sum of erase counts.

5. The memory system of claim 1, wherein the main core transmits, to the second sub-core, an inter-core communication message instructing the second sub-core to process the meta data segment.

6. The memory system of claim 5, wherein the inter-core communication message includes an identifier of the first sub-core and an address of a location where the meta data segment is stored.

7. The memory system of claim 1, wherein the main core, at a first boot after executing the shutdown command, controls the first sub-core and the second sub-core to store the meta data segment processed by the second sub-core in a memory die corresponding to the first sub-core.

8. An operating method of a memory system including a plurality of memory dies, a main core executing an operation of a first layer, and a plurality of sub-cores executing an operation of a second layer which is a lower layer of the first layer, each of the plurality of sub-cores being configured to execute an operation of storing meta data in a corresponding memory die among the plurality of memory dies, the operating method comprising:
   receiving a shutdown command from a host attempting to shut down the memory system;
   selecting, by the main core during execution of the shutdown command, a second sub-core to store a meta data segment which is at least a part of a changed part among meta data to be processed by a first sub-core among the plurality of sub-cores; and
   controlling, by the main core, the plurality of sub-cores so that the second sub-core processes the meta data segment.

9. The operating method of the memory system of claim 8, wherein the first layer is a host interface layer (HIL), and the second layer is a flash translation layer (FTL).

10. The operating method of the memory system of claim 8, wherein the selecting of the second sub-core comprises determining, as candidate sub-cores for the second sub-core among the plurality of sub-cores, one or more sub-cores, which have completed the operation of storing changed meta data in the corresponding memory dies and are in an idle state.

11. The operating method of the memory system of claim 10, wherein the selecting of the second sub-core further comprises determining, as the second sub-core among the candidate sub-cores, a sub-core, of which the corresponding memory die includes meta data storage blocks having a least sum of erase counts.

12. The operating method of the memory system of claim 8, wherein controlling the plurality of sub-cores comprises transmitting, by the main core, an inter-core communication message to the second sub-core in order for the second sub-core to process the meta data segment.

13. The operating method of the memory system of claim 12, wherein the inter-core communication message includes an identifier of the first sub-core and an address of a location where the meta data segment is stored.

14. The operating method of the memory system of claim 8, further comprising controlling, at a first boot after the executing of the shutdown command the first sub-core and the second sub-core to store the meta data segment processed by the second sub-core in a memory die corresponding to the first sub-core.

15. A controller comprising:

first and second sub-cores configured to drive first and second flash translation layers (FTLs) to control a nonvolatile memory device to perform operations on a first die and a second die included therein, respectively, the operations of the first and second FTLs being independent of each other; and a main core configured to:

control, when the controller is shut down, the first and second sub-cores to store a first meta segment, which is handled by the first sub-core before the shut-down, into the second die, and control, when the controller is boot up after the shut-down, the first and second sub-cores to move the first meta segment from the second die to the first die, wherein the second sub-core is further configured to provide, when storing the first meta segment, the main core with information on the first and second sub-cores and a location where the first meta segment is stored within the second die, and wherein the main core controls, during the boot-up, the first and second sub-cores based on the information.

\* \* \* \* \*